(12) United States Patent
Momiyama

(10) Patent No.: US 7,205,616 B2
(45) Date of Patent: Apr. 17, 2007

(54) SEMICONDUCTOR DEVICE AND MANUFACTURING METHOD OF THE SAME

(75) Inventor: Youichi Momiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 190 days.

(21) Appl. No.: 11/049,694

(22) Filed: Feb. 4, 2005

(65) Prior Publication Data

US 2005/0127449 A1    Jun. 16, 2005

Related U.S. Application Data

(63) Continuation of application No. PCT/JP03/00959, filed on Jan. 31, 2003.

(51) Int. Cl.
*H01L 29/76* (2006.01)

(52) U.S. Cl. .................. 257/369; 257/336; 257/344; 257/408; 257/369

(58) Field of Classification Search ............... None
See application file for complete search history.

(56) References Cited

U.S. PATENT DOCUMENTS 6,380,053 B1    4/2002    Komatsu

FOREIGN PATENT DOCUMENTS

| JP | 10-125916 | 5/1998 |
| JP | 11-87706 | 3/1999 |

OTHER PUBLICATIONS

Y. Momiyama et al., Lateral Extension Engineering using Nitrogen Implantation (N-tub) for High-Performance 40-nm pMOSFETs, IEDM Technical Digest, pp. 647-650, 27.3, (2002).

*Primary Examiner*—Evan Pert
*Assistant Examiner*—Tan Tran
(74) *Attorney, Agent, or Firm*—Westerman, Hattori, Daniels & Adrian, LLP

(57) ABSTRACT

In consideration of an optimum combination of impurities used for the purpose of forming an extension region (13) and a pocket region (11) and further inhibiting impurity diffusion in the extension region (13) when an impurity diffusion layer (21) is formed in a semiconductor device having an nMOS structure, at least phosphorus (P) is used as an impurity in the extension region (13), at least indium (In) is used as an impurity in the pocket region (11), and additionally carbon (C) is used as a diffusion inhibiting substance. Consequently, it is possible to easily and surely realize the scaling down/high integration of elements while improving threshold voltage roll-off characteristics and current drive capability and reducing a drain leakage current especially in the semiconductor device having the nMOS structure, and particularly by making the optimum design of a semiconductor device having a CMOS structure possible, improve device performance and reduce power consumption.

9 Claims, 6 Drawing Sheets

RTA for activating pMOS extension and pocket, and also for Deep S/D and Gate impurities

SEMICONDUCTOR DEVICE AND MANUFACTURING METHOD OF THE SAME

This application is a continuation of international application PCT/JP03/00959 filed on Jan. 31, 2003.

TECHNICAL FIELD

The present invention relates to a semiconductor device having a source/drain extension structure and a manufacturing method of the same, and particularly it is suitable for application to a semiconductor device having a CMOS structure.

BACKGROUND ART

Conventionally, an LDD structure has been adopted as the structure of a MOS transistor in order to suppress a short channel effect and improve hot carrier immunity and the like.

On the other hand, with the progress of the scaling down and high integration of a semiconductor device, a reduction in gate length is promoted in the MOS transistor. However, due to the reduction in gate length, the influence of parasitic resistance of source/drain becomes manifest. Hence, to deal with this, a MOS transistor having a so-called extension structure is devised. In this MOS transistor, a pair of impurity diffusion layers are formed by forming shallow extension regions, thereafter forming sidewalls or the like on a gate electrode, and then forming deep source/drain regions so as to partly overlap with the extension regions.

However, recently, further scaling down and high integration of the MOS transistor have been progressing rapidly, and the following two problems emerge from the MOS transistor having the extension structure.

(1) For further scaling down of the MOS transistor, a concentration profile of the extension region is important. In particular, a lateral concentration profile in the extension region is a key factor in improving current drive capability. In this case, threshold voltage roll-off characteristics and the current drive capability, that is, electric resistance of the extension region have a so-called trade-off relationship, and it is necessary to minutely adjust these two as shown below.

In order to improve the threshold voltage roll-off characteristics, it is desirable to secure the longest possible metallurgical effective gate length with respect to a provided physical gate length. This makes it possible to set the impurity concentration of a channel low, and thereby scattering of carriers by impurities reduces, which leads to an improvement in mobility, resulting in an improvement in the current drive capability of the MOS transistor. If the metallurgical effective gate length is the same here, the physical gate length can be made shorter as the lateral profile becomes steeper.

Meanwhile, the extension region needs to sufficiently overlap with the gate electrode. The carrier density in an inversion layer in a strong inversion condition reaches the order of $10^{19}/cm$, whereby there is a possibility that the extension region directly below an edge of the gate electrode, that is, a tip portion of the extension region functions as an electric resistance and causes a deterioration in current drive capability. To prevent this, it is necessary that the impurity carrier concentration at the tip portion is at least $5 \times 10^{19}/cm^3$ or more.

To form the extension region where the impurity concentration is controlled as described above, the lateral concentration profile in the extension region needs to be steep. Namely, it is desirable to secure the impurity concentration of $5 \times 10^{19}/cm^3$ or more at the tip portion and form a concentration profile such that the concentration reduces sharply from the tip portion toward the channel. Ideally, it is suitable to form the extension region in a so-called box shape. However, the lateral concentration profile is generally dominated by a diffusion phenomenon, and therefore it is extremely difficult to control its steepness as desired.

(2) In a present nMOS transistor, arsenic (As) is used as an impurity when the extension region is formed. Arsenic (As) is used since it has a steeper concentration gradient than phosphorus (P) and it is excellent in roll-off characteristics and current drive capability, but there arises a problem that since it is a heavy element, a defect caused at the time of ion implantation does not completely disappear after an annealing process for activation, leading to an increase in components of a source/drain junction leakage and particularly components around the gate electrode.

To suppress a leakage current, it is effective to add annealing to eliminate the defect, but at the same time, the impurity is diffused by annealing, which goes against the scaling down, and hence a different method is needed. A lower power consumption device has a problem that the power consumption by this leakage current is a rate-determining factor, and hence a reduction in power consumption becomes difficult.

Moreover, to prevent the leakage current, P is sometimes used in place of As. However, in the case of P, tail diffusion increases, and hence P cannot be applied to a fine transistor if nothing is done.

As a method for solving the aforementioned problems, concerning a pMOS transistor, a method of adopting nitrogen implantation such as shown in 2002 IEDM 27.3 p. 647–p. 650 and a method of adopting carbon implantation technology as shown in Japanese Patent Application Laid-open No. Hei 10-125916 are published. According to these methods, roll-off is improved. It is known that nitrogen inhibits diffusion of boron (B), and hence roll-off characteristics of the pMOS transistor are improved. Moreover, in the pMOS transistor, the junction leakage also reduces. Carbon has a function of making defects (including interstitial Si) disappear, and hence the roll-off characteristics of the pMOS transistor are similarly improved. Although not described in detail, there is a possibility that a tunneling site which causes the junction leakage disappears and that the leakage current reduces. However, even if so, a fully satisfactory result has not been reached.

Any of the aforementioned prior arts is thought to be effective in the pMOS transistor, but does not produce a marked effect on the nMOS transistor. A primary factor is that in the nMOS transistor, generally arsenic (As) is used in an extension and does not behave like boron (B) or phosphorus (P) which diffuses while pairing up with interstitial Si. Moreover, it is thought to be based, for example, on the fact that in a semiconductor device in which boron is used as an impurity in a pocket region, arsenic inhibits activation of boron, and accelerates diffusion of boron according to conditions.

SUMMARY OF THE INVENTION

The present invention is made in view of the aforementioned problems, and its object is to provide a semiconductor device capable of easily and surely realizing the scaling down/high integration of elements while improving threshold voltage roll-off characteristics and current drive capability and reducing a drain leakage current in a semiconductor device having an nMOS structure, and particularly by making the optimum design of a semiconductor device having a CMOS structure possible, improving device performance and reducing power consumption, and a manufacturing method of the same.

A semiconductor device of the present invention includes: a semiconductor substrate; a gate electrode formed on the semiconductor substrate with a gate insulating film therebetween; and a pair of impurity diffusion layers formed on a surface layer of the semiconductor substrate on both sides of the gate electrode, the impurity diffusion layer including: a shallow first region containing at least phosphorus (P) and partially overlapping with a lower region of the gate electrode; a second region containing an n-type impurity, partially overlapping with the first region, and being deeper than the first region; a third region containing at least indium (In); and a fourth region containing carbon (C).

A manufacturing method of a semiconductor device of the present invention includes: a first step of forming a gate electrode on a semiconductor substrate with a gate insulating film therebetween; a second step of introducing at least indium (In) into a surface layer of the semiconductor substrate on both sides of the gate electrode with the gate electrode as a mask; a third step of introducing carbon (C) into the surface layer of the semiconductor substrate on both sides of the gate electrode with the gate electrode as a mask; a fourth step of introducing at least phosphorus (P) into the surface layer of the semiconductor substrate on both sides of the gate electrode with the gate electrode as a mask; and a fifth step of introducing an n-type impurity into the surface layer of the semiconductor substrate on both sides of the gate electrode deeper than the phosphorous (P) in the fourth step with at least the gate electrode as a mask, wherein after the first step, the second step to the fifth step are performed in arbitrary order.

Another aspect of a manufacturing method of a semiconductor device of the present invention includes the steps of: forming a gate electrode on a semiconductor substrate with a gate insulating film therebetween; introducing at least indium (In) into a surface layer of the semiconductor substrate on both sides of the gate electrode with the gate electrode as a mask; introducing carbon (C) into the surface layer of the semiconductor substrate on both sides of the gate electrode with the gate electrode as a mask; introducing at least phosphorus (P) into the surface layer of the semiconductor substrate on both sides of the gate electrode with the gate electrode as a mask; forming a sidewall film only on both side surfaces of the gate electrode; and introducing an n-type impurity into the surface layer of the semiconductor substrate on both sides of the sidewall film deeper than the phosphorous (P) in the fourth step with the sidewall film as a mask.

Still another aspect of a manufacturing method of a semiconductor device of the present invention includes the steps of: forming a gate electrode on a semiconductor substrate with a gate insulating film therebetween; forming a dummy sidewall film only on both side surfaces of the gate electrode; introducing phosphorus (P) into a surface layer of the semiconductor substrate on both sides of the dummy sidewall film with the dummy sidewall film as a mask; introducing carbon (C) into the surface layer of the semiconductor substrate on both sides of the dummy sidewall film with the dummy sidewall film as a mask; removing the dummy sidewall film; introducing at least phosphorus (P) into the surface layer of the semiconductor substrate on both sides of the gate electrode with the gate electrode as a mask; and introducing at least indium (In) into the surface layer of the semiconductor substrate on both sides of the gate electrode with the gate electrode as a mask.

DETAILED DESCRIPTION OF THE PREFERRED EMBODIMENTS

Basic Gist of the Present Invention

First, the basic gist forming a main constitution of the present invention will be described.

In consideration of an optimum combination of impurities used for the purpose of forming an extension region and a pocket region and further suppressing impurity diffusion in the extension region when an impurity diffusion layer is formed in a semiconductor device having an nMOS structure, the present inventor comes up with the idea of using at least phosphorus (P) as an impurity in the extension region and at least indium (In) as an impurity in the pocket region (11), and additionally using carbon (C) as a diffusion inhibiting substance.

Namely, the introduced carbon inhibits diffusion of P which is the impurity in the extension region in an activation process (annealing) of the impurity, thereby improving roll-off characteristics. Moreover, in this case, inactivation of In which is the impurity in the pocket region is not accelerated, whereby the effect of forming the pocket region (further improvements in threshold voltage roll-off characteristics and current drive capability) is maintained as it is. Accordingly, both a diffusion inhibiting effect and a pocket effect can be achieved without being mutually weakened at all, thereby realizing an improvement in element performance. At the same time, a junction leakage from a drain junction reduces.

Specific Embodiments

Based on the aforementioned basic gist of the present invention, specific embodiments will be described below. Here, a CMOS transistor is shown as an example of a semiconductor device, and for convenience, its structure will be explained together with its manufacturing method. Incidentally, the present invention is not limited to the CMOS transistor but applicable to a semiconductor device having a transistor structure including a gate and source/drain.

First Embodiment

FIG. 1A to FIG. 1C and FIG. 2A and FIG. 2B are schematic sectional views showing a manufacturing method of a CMOS transistor according to the first embodiment step by step.

Figure 1A:
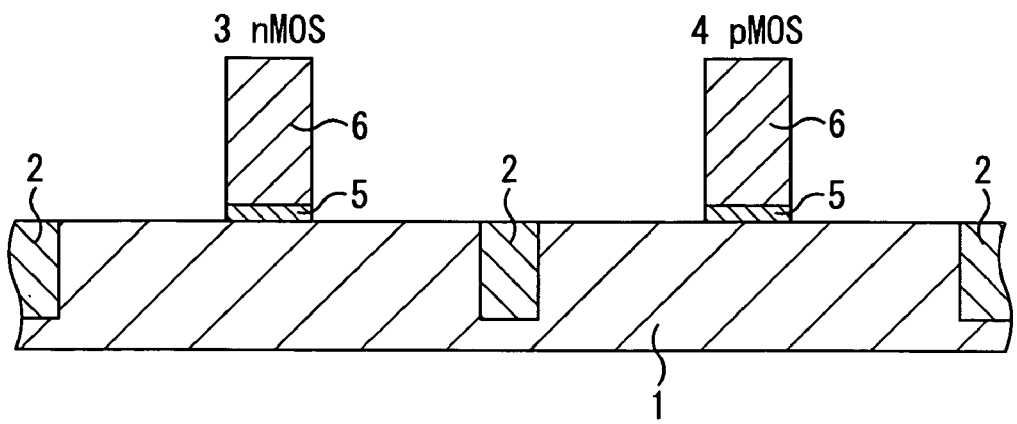
FIG. 1A to FIG. 1C are schematic sectional views showing a manufacturing method of a CMOS transistor according to a first embodiment step by step.

First, as shown in FIG. 1A, element active regions and gate electrodes are formed by a normal CMOS process.

More specifically, for example, by an STI (Shallow Trench Isolation) method, trenches are formed in portions of a silicon semiconductor substrate 1 which become element isolation regions by photolithography and dry etching, a silicon oxide film is deposited so as to be embedded in the trenches by a CVD method or the like, the silicon oxide film is removed by polishing by a CMP (Chemical Mechanical Polishing) method so as to fill up only the trenches, STI element isolation structures 2 are formed, and an n-type element active region 3 and a P-type element active region 4 are delimited. Subsequently, a p-type impurity and an n-type impurity are ion-implanted into the n-type element active region 3 and the p-type element active region 4, respectively, to form a p-well 3a and an n-well 4a. Here, the n-type element active region 3 becomes an nMOS transistor forming portion and the p-type element active region 4 becomes a pMOS transistor forming portion.

Then, after a gate insulating film 5 is formed on the element active regions 3 and 4 by thermal oxidation or the like and then a polycrystalline silicon film is deposited by the CVD method or the like, these polycrystalline silicon film and gate insulating film 5 are patterned in an electrode shape by photolithography and dry etching to form gate electrodes 6 on the element active regions 3 and 4 with the gate insulating films 5 therebetween, respectively.

Figure 1B:
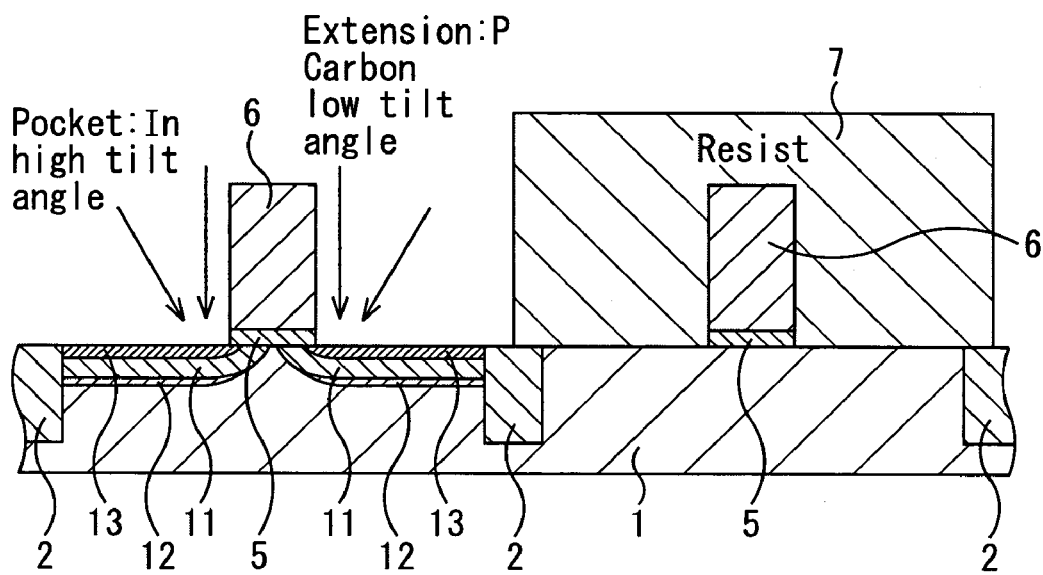

Thereafter, as shown in FIG. 1B, a photoresist is applied onto the entire surface and fabricated by photolithography to form a resist mask 7 in which an opening only for the n-type element active region 3 is made.

Then, ion-implantation to form pocket regions is first performed only in the n-type element active region 3.

More specifically, in the n-type element active region 3 exposed from the resist mask 7, a p-type impurity, indium (In) in this case, is ion-implanted into a surface layer of the semiconductor substrate 1 on both sides of the gate electrode 6 with the gate electrode 6 as a mask to form pocket regions 11.

Ion implantation is performed in a tilted state with respect to a direction perpendicular to the surface of the semiconductor substrate 1 under the following conditions of the ion implantation of In: an acceleration energy between 20 keV and 100 keV and a dose amount between $1\times10^{12}/cm^2$ and $2\times10^{13}/cm^2$. This tilt angle is between 0° and 45° with the direction perpendicular to the surface of the substrate as 0°. In this case, the ion implantation is performed from four directions which are respectively symmetrical with respect to the substrate surface with the aforementioned acceleration energy and dose amount. In the following description, on the premise that when the tilt angle is given, implantation from four directions is similarly performed, an explanation thereof is omitted. Incidentally, boron (B) may be used as an impurity in addition to In, but B alone is not used.

Subsequently, carbon (C) is implanted as a diffusion inhibiting substance.

More specifically, in the n-type element active region 3 exposed from the resist mask 7, carbon (C) which is the diffusion inhibiting substance is implanted into the surface layer of the semiconductor substrate 1 on both sides of the gate electrode 6 with the gate electrode 6 as a mask to form C diffusion regions 12 to such a degree that the C diffusion region 12 is slightly deeper than the pocket region 11 (to such a degree that the C diffusion region 12 contains the pocket region 11). Conditions of this implantation are an acceleration energy between 2 keV and 10 keV (a main condition for almost overlapping with the pocket region 11), a dose amount between $1\times10^{14}/cm^2$ and $2\times10^{15}/cm^2$, and a tilt angle between 0° and 10°. As the dose amount of C is increased from $1\times10^{14}/cm^2$, a diffusion inhibiting effect increases, and a saturation tendency is shown at $2\times10^{15}/cm^2$ or more.

Then, ion implantation to form extension regions is performed.

More specifically, in the n-type element active region 3 exposed from the resist mask 7, phosphorus (P) which is an n-type impurity is ion-implanted into the surface layer of the semiconductor substrate 1 on both sides of the gate electrode 6 with the gate electrode 6 as a mask to form extension regions 13. P has a higher solid-solubility limit than arsenic (As), so that it has the advantage of being able to form a diffusion layer with a lower resistance at a junction of the same depth. Conditions of the ion implantation of P are an acceleration energy between 0.2 keV and 2 keV, a dose amount between $1\times10^{14}/cm^2$ and $2\times10^{15}/cm^2$, and a tilt angle between 0° and 10°.

It is also possible to use As as an impurity in the extension region in addition to P. The formation of the extension region by As alone is possible in principle, but it is undesirable in terms of a leakage current. Originally, As does not cause an enhanced diffusion phenomenon due to TED (Transient Enhanced Diffusion), whereby the effectiveness of the introduction of C is small. However, in some cases, C is used for the purpose of inhibiting lateral diffusion of P which is generally used in deep S/D. The aforementioned optimum conditions change according to the presence or absence of a spacer (mask) and the thickness thereof, and when the spacer is provided, it is necessary to set the acceleration energy rather high in the formation of the pocket regions and to lead a rather large dose amount in the formation of the extension regions. In this example, the implantation of C is performed after the formation of the resist mask 7, but implantation into the entire surface including the p-type element active region 4 before the formation of the resist mask 7 is also possible. However, the method shown in this embodiment is more advantageous since the conditions of the implantation of C can be optimized independently in the n-type and p-type element active regions 3 and 4.

Figure 1C:
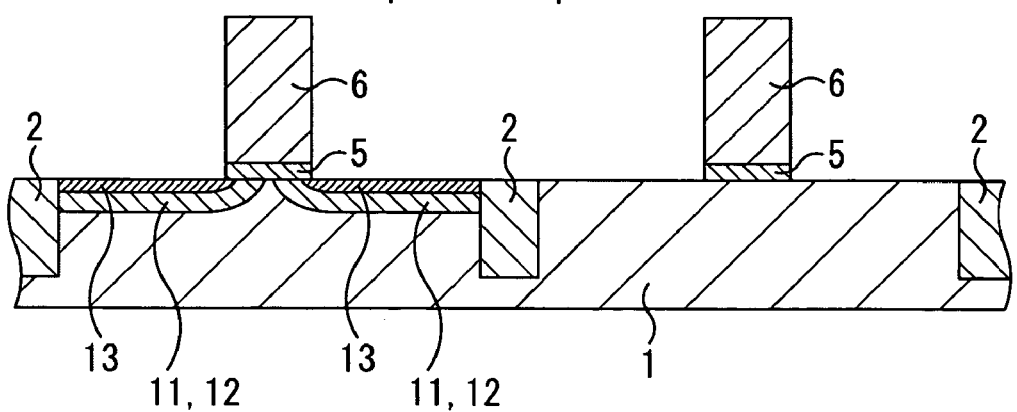

Subsequently, as shown in FIG. 1C, in order to activate In, annealing (rapid thermal annealing: RTA) is performed after the resist mask 7 is removed by ashing or the like. Annealing conditions are as follows: annealing is performed at 900° C. to 1025° C. for almost 0 seconds in an inert atmosphere such as nitrogen or a very small amount of oxygen atmosphere. In this annealing, consideration is given to an improvement in the electrical activation of In which is ion-implanted to form the pocket regions 11, and this annealing can be omitted by adjusting subsequent thermal treatment and thermal process.

Incidentally, in this embodiment, the case where no sidewall is formed on side walls of the gate electrode 6 in each of the aforementioned implantation processes is shown as an example, but in order to obtain an optimum overlap between the extension region and the gate electrode 6, it is suitable to form thin side walls (not shown) each having a film thickness approximately between 5 nm and 20 nm on both side surfaces of the gate electrode 6 and to perform the aforementioned respective implantations in this state. Moreover, it is also possible to form sidewalls on the gate electrode 6 of either one of the element active regions 3 and 4. The film structure and shape of the sidewall does not particularly matter, and the sidewall is only required to have a function as a spacer (mask).

Figure 2A:
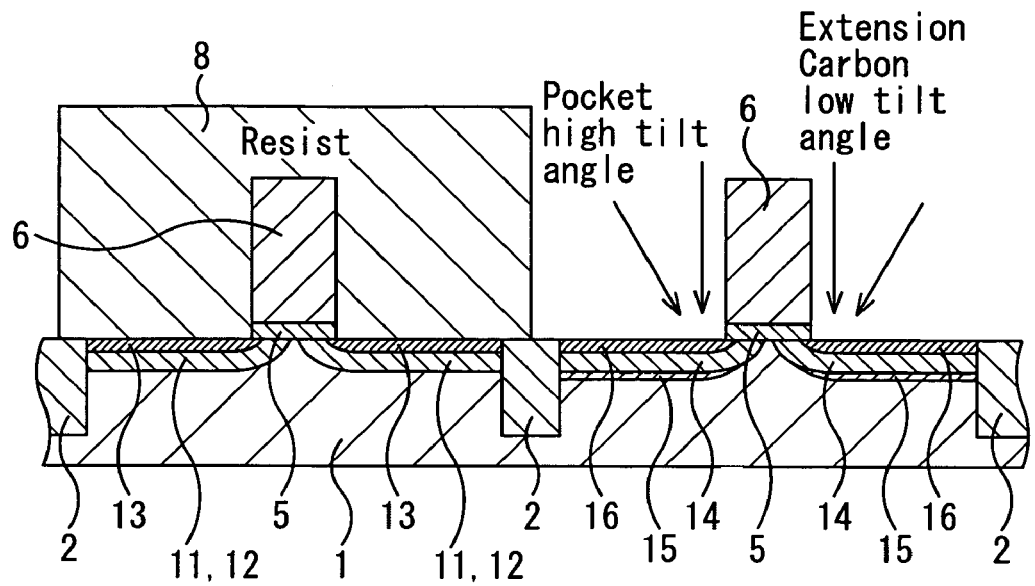
FIG. 2A and FIG. 2B are schematic sectional views, subsequent to FIG. 1A to FIG. 1C, showing the manufacturing method of the CMOS transistor according to the first embodiment step by step.

Thereafter, as shown in FIG. 2A, a photoresist is applied onto the entire surface and fabricated by photolithography to form this time a resist mask 8 in which an opening only for the p-type element active region 4 is made.

Then, ion-implantation to form pocket regions is first performed.

More specifically, in the p-type element active region 4 exposed from the resist mask 8, an n-type impurity, antimony (Sb) in this case, is ion-implanted into the surface layer of the semiconductor substrate 1 on both sides of the gate electrode 6 with the gate electrode 6 as a mask to form pocket regions 14.

Conditions of the ion implantation of Sb are an acceleration energy between 20 keV and 100 keV, a dose amount between $2 \times 10^{12}/cm^2$ and $2 \times 10^{13}/cm^2$, and a tilt angle between 0 and 45°. Incidentally, in this case, the ion implantation may be performed using a different n-type impurity such as As or P in place of Sb.

Subsequently, carbon (C) which is the diffusion inhibiting substance is implanted.

More specifically, in the p-type element active region 4 exposed from the resist mask 8, carbon (C) which is the diffusion inhibiting substance is implanted into the surface layer of the semiconductor substrate 1 on both sides of the gate electrode 6 with the gate electrode 6 as a mask to form C diffusion regions 15 to such a degree that the C diffusion region 15 is slightly deeper than the pocket region 14 (to such a degree that the C diffusion region 15 contains the pocket region 14). Conditions of this implantation are an acceleration energy between 2 keV and 10 keV (a main condition for almost overlapping with the pocket region 14), a dose amount between $1 \times 10^{14}/cm^2$ and $2 \times 10^{15}/cm^2$, and a tilt angle between 0° and 10°. In this case, it is also possible to introduce nitrogen (N) simultaneously with C, or it is also possible to introduce N alone into the p-type element active region 4 if C is used as the diffusion inhibiting substance in the n-type element active region 3. Moreover, this implantation can be also combined with a pre-amorphization technique by germanium (Ge) or silicon (Si).

Then, ion implantation to form extension regions is performed.

More specifically, in the p-type element active region 4 exposed from the resist mask 8, a p-type impurity, boron (B) in this case, is ion-implanted into the surface layer of the semiconductor substrate 1 on both sides of the gate electrode 6 with the gate electrode 6 as a mask to thereby form extension regions 16.

Conditions of the ion implantation of B are an acceleration energy between 0.2 keV and 0.5 keV, a dose amount between $1 \times 10^{14}/cm^2$ and $2 \times 10^{15}/cm^2$, and a tilt angle between 0° and 10°. When $BF_2$ is used here as ion species to be implanted, it becomes optimum when the acceleration energy is set between 1 keV and 2.5 keV and the dose amount is almost doubled. These optimum conditions change according to the presence or absence of sidewalls and the thickness thereof, and when the sidewalls are provided, it is necessary to set the acceleration energy rather high in the ion implantation for the formation of the pocket regions and to lead a rather large dose amount in the ion implantation for the formation of the extension regions to thereby obtain the optimum conditions.

Subsequently, deep source/drain regions (deep S/D regions) are formed in each of the element active regions 3 and 4.

Figure 2B:
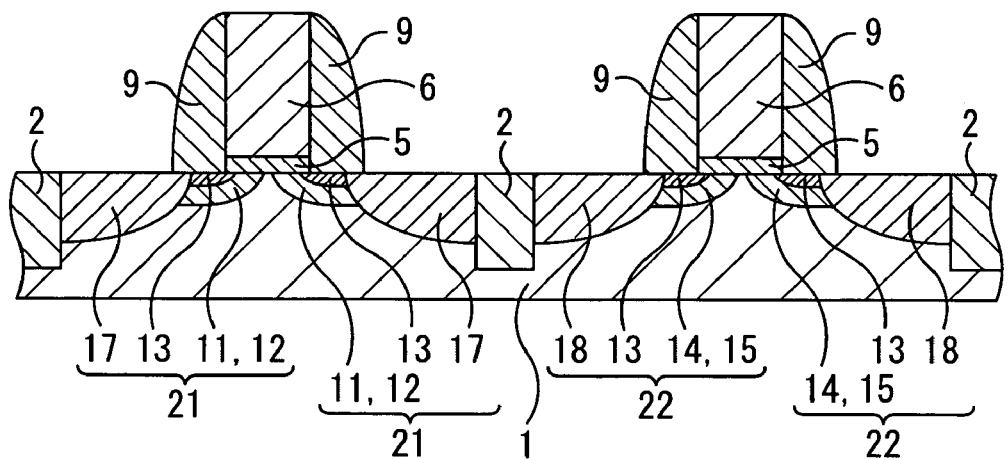

More specifically, as shown in FIG. 2B, after the resist mask 8 is removed by ashing or the like, a silicon oxide film is deposited by a CVD method or the like, and the entire surface of this silicon oxide film is subjected to anisotropic etching (etched back) to thereby leave the silicon oxide film only on side surfaces of each of the gate electrodes 6 to form sidewalls 9.

A photoresist is applied onto the entire surface and fabricated by photolithography to form a resist mask (not shown) in which an opening only for the n-type element active region 3 is made. Then, in the n-type element active region 3 exposed from the resist mask, an n-type impurity, phosphorus (P) in this case, is ion-implanted into the surface layer of the semiconductor substrate 1 on both sides of the gate electrode 6 with the respective gate electrode 6 and sidewalls 9 as a mask to form deep S/D regions 17. Conditions of the ion implantation of P are an acceleration energy between 4 keV and 20 keV, a dose amount between $2 \times 10^{15}/cm^2$ and $2 \times 10^{16}/cm^2$, and a tilt angle between 0° and 10°. Incidentally, in place of P, arsenic (As) may be ion-implanted.

Subsequently, in the same manner as above, after the resist mask is removed by ashing or the like, a photoresist is applied onto the entire surface and fabricated by photolithography to form this time a resist mask (not shown) in which an opening only for the p-type element active region 4 is made. Then, in the p-type element active region 4 exposed from this resist mask, a p-type impurity, B in this case, is ion-implanted into the surface layer of the semiconductor substrate 1 on both sides of the gate electrode 6 with the respective gate electrode 6 and sidewalls 9 as a mask to form deep S/D regions 18. Conditions of the ion implantation of B are an acceleration energy between 2 keV and 5 keV, a dose amount between $2 \times 10^{15}/cm^2$ and $2 \times 10^{16}/cm^2$, and a tilt angle between 0° and 10°. Incidentally, for the ion implantation of B, ions containing B such as $BF_2$ can be used.

Thereafter, by annealing (RTA) between 1000° C. and 1050° for almost 0 seconds, the respective impurities are activated. As a result, n-type impurity diffusion layers 21 composed of the pocket regions 11, the C diffusion regions 12, the extension regions 13, and the deep S/D regions 17, respectively, are formed in the n-type element active region 3, and p-type impurity diffusion layers 22 composed of the pocket regions 14, the C diffusion regions 15, the extension regions 16, and the deep S/D regions 18, respectively, are formed in the p-type element active region 4.

Then, after a forming process of an interlayer insulating film, contact holes, various kinds of wiring layers, and so on, the nMOS transistor is finished in the n-type element active region 3, and the pMOS transistor is finished in the p-type element active region 4, respectively.

Incidentally, in this embodiment, the case where after a gate electrode is formed, a pair of impurity diffusion layers which becomes source/drain is shown as an example, but the present invention is not limited to this case, and the aforementioned order of formation may be changed appropriately.

In this embodiment, the case where in the formation of the respective impurity diffusion layers 21 and 22, the process progresses in order of ion implantation of In to form the pocket regions, implantation of C to inhibit diffusion, and ion implantation of P to form the extension regions as an example, but this order is arbitrary and does not particularly matter. Depending on the order, the concentration profile immediately after ion implantation in the pocket region or the extension region is influenced by the effect of amorphization, whereby respective optimum designs are needed. In addition, in order to inhibit diffusion in the deep S/D regions, the introduction of C at the time of ion implantation thereinto is effective.

As explained above, according to this embodiment, it is possible to easily and surely realize the scaling down/high integration of elements while improving threshold voltage roll-off characteristics and current drive capability and reducing a drain leakage current especially in an nMOS transistor, and by making the optimum design of a CMOS transistor possible, improve device performance and reduce power consumption.

Figure 3A:
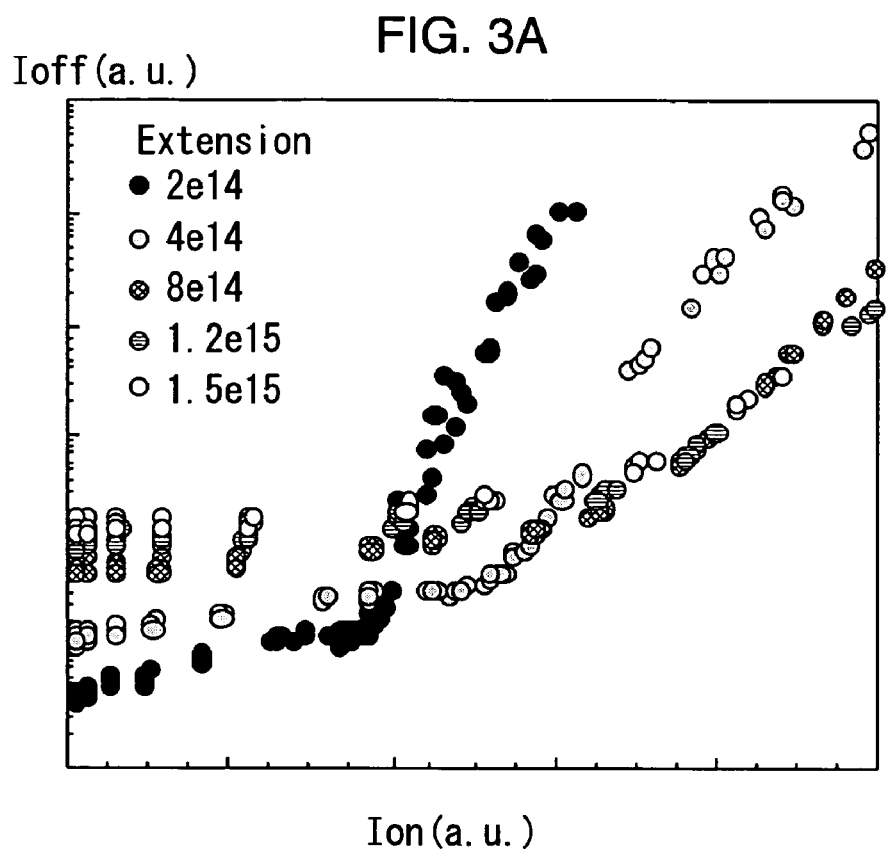
FIG. 3A and FIG. 3B are characteristic charts showing results of investigation of roll-off characteristics and current drive capability of an nMOS transistor according to this embodiment.
Figure 3B:
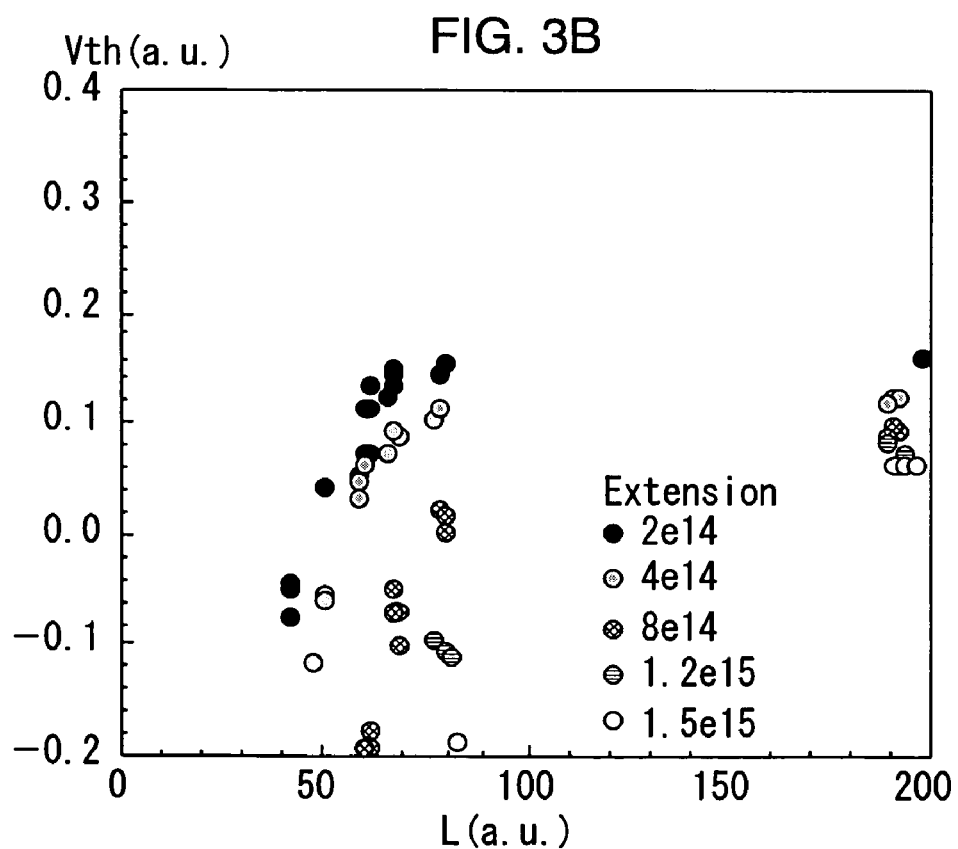
Figure 4A:
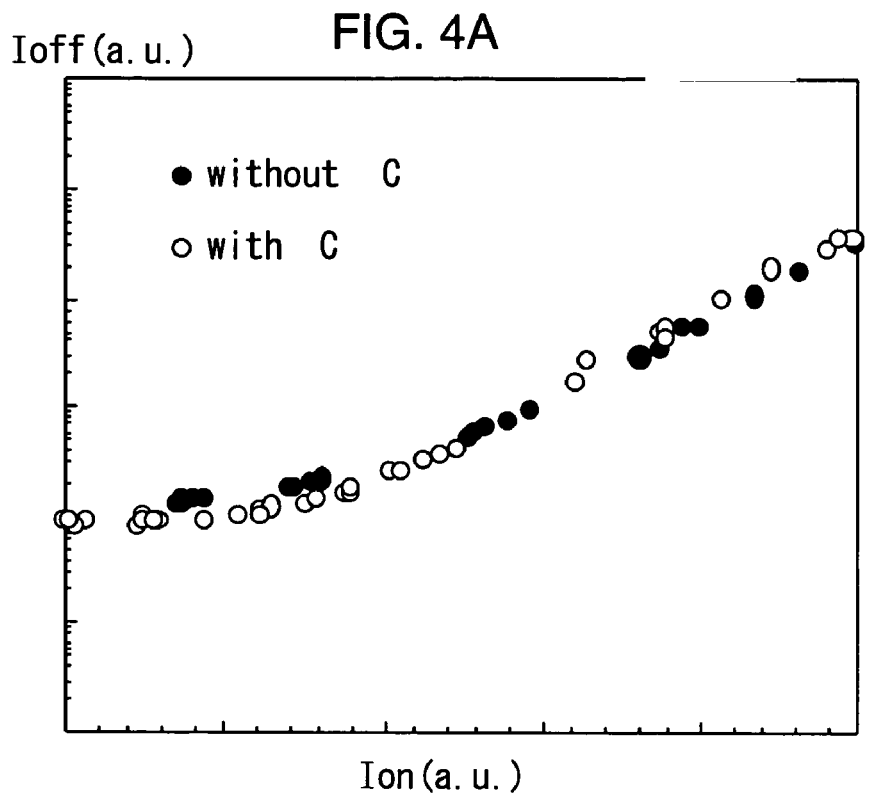
FIG. 4A and FIG. 4B are characteristic charts showing results of investigation of the roll-off characteristics and current drive capability of the nMOS transistor according to this embodiment.
Figure 4B:
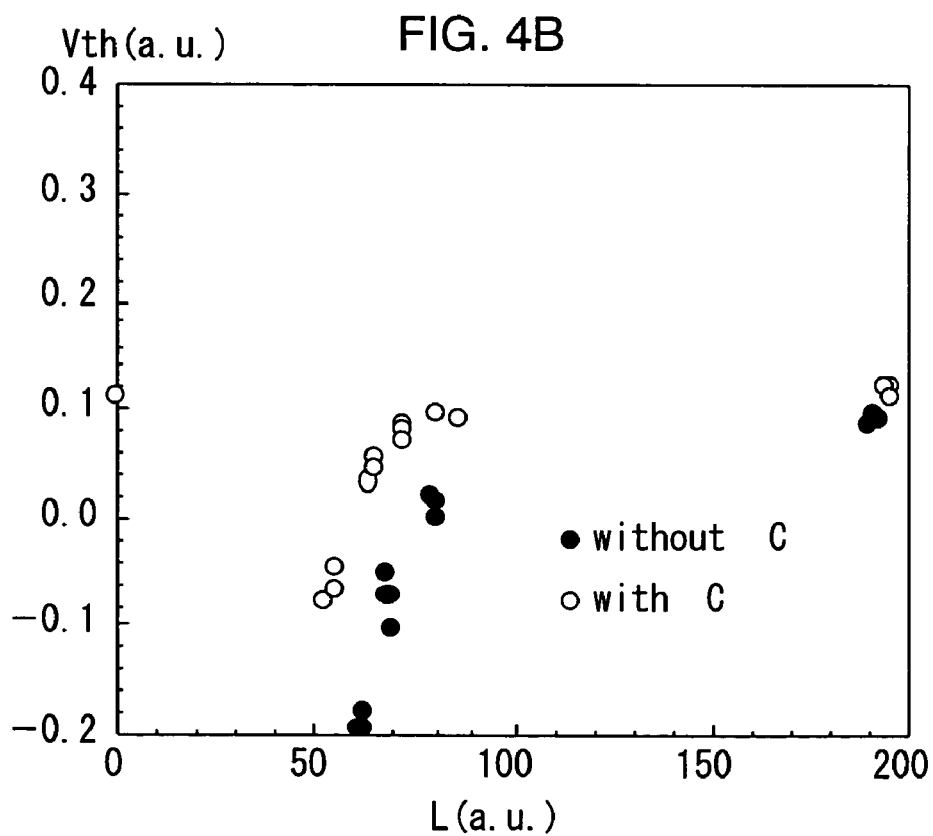

More specifically, results of investigation of roll-off characteristics and current drive capability of the nMOS transistor according to this embodiment will be shown in FIG. 3A and FIG. 3B and FIG. 4A and FIG. 4B. FIG. 3A and FIG. 3B show current drive capability (on-state current: $I_{on}$) (FIG. 3A) and roll-off characteristics (L) (FIG. 3B) when the dose amount of P in the extension region is changed without C which is the diffusion inhibiting substance being introduced, and FIG. 4A and FIG. 4B show current drive capability (on-state current: $I_{on}$) (FIG. 4A) and roll-off characteristics (L) (FIG. 4B) when C which is the diffusion inhibiting substance is introduced (with C) and not introduced (without C).

As shown in FIG. 3A and FIG. 3B, if the dose amount of P in the extension region is reduced in order to improve the roll-off characteristics, Ion also deteriorates rapidly. In contrast, when C is introduced as shown in FIG. 4A and FIG. 4B, the roll-off characteristics are improved while $I_{on}$ being maintained.

Second Embodiment

In the second embodiment, a case where a CMOS transistor is formed by a so-called disposal process for the purpose of reducing heat quantity at the time of formation of extension regions is shown as an example.

In the disposal process, after a gate electrode is formed, deep S/D regions are formed earlier using dummy sidewalls. Thereafter, by removing the dummy sidewalls and performing implantation into extensions and annealing at a relative low temperature, diffusion in the extensions is inhibited as much as possible. A problem in this process is in what way a design is made so that phosphorus (P) (in the case of the nMOS transistor) or boron (B) (in the case of the pMOS transistor) which is the impurity to be ion-implanted when the deep S/D regions are formed is not diffused toward a channel. Here, the aforementioned carbon (C) implantation technique can be utilized. By introducing C when the deep S/D regions are formed, lateral diffusion is inhibited, and moreover sufficient activation can be ensured, whereby an ideal box-shaped profile can be approached. C introduced this time contributes also to inhibition of diffusion in the extension regions. It is of course possible to additionally introduce C under the optimum conditions when the extension regions are formed.

FIG. 5A to FIG. 5C and FIG. 6A to FIG. 6C are schematic sectional views showing a manufacturing method of the CMOS transistor according to the second embodiment step by step.

Figure 5A:
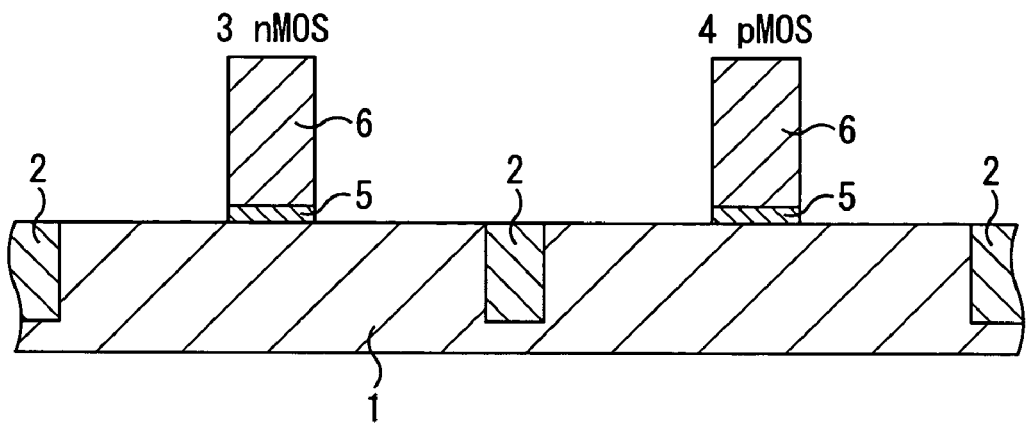
FIG. 5A to FIG. 5C are schematic sectional views showing a manufacturing method of a CMOS transistor according to a second embodiment step by step.

First, as shown in FIG. 5A, element active regions and gate electrodes are formed by a normal CMOS process.

More specifically, for example, by an STI (Shallow Trench Isolation) method, trenches are formed in portions of a silicon semiconductor substrate 1 which become element isolation regions by photolithography and dry etching, a silicon oxide film is deposited so as to be embedded in the trenches by a CVD method or the like, the silicon oxide film is removed by polishing by a CMP (Chemical Mechanical Polishing) method so as to fill up only the trenches, STI element isolation structures 2 are formed, and an N-type element active region 3 and a P-type element active region 4 are delimited. Subsequently, a p-type impurity and an n-type impurity are ion-implanted into the n-type element active region 3 and the p-type element active region 4, respectively, to form a p-well 3a and an n-well 4a. Here, the n-type element active region 3 becomes an nMOS transistor forming portion and the p-type element active region 4 becomes a pMOS transistor forming portion.

Then, after a gate insulating film 5 which is a silicon oxide film is formed on the element active regions 3 and 4 by thermal oxidation or the like and a polycrystalline silicon film is deposited by the CVD method or the like, these polycrystalline silicon film and gate insulating film 5 are patterned in an electrode shape by photolithography and dry etching to form gate electrodes 6 on the element active regions 3 and 4 with gate insulating films 5 therebetween, respectively. Incidentally, a silicon oxynitride film may be formed as the gate insulating film 5.

Subsequently, deep source/drain regions (deep S/D regions) are formed in each of the element active regions 3 and 4.

Figure 5B:
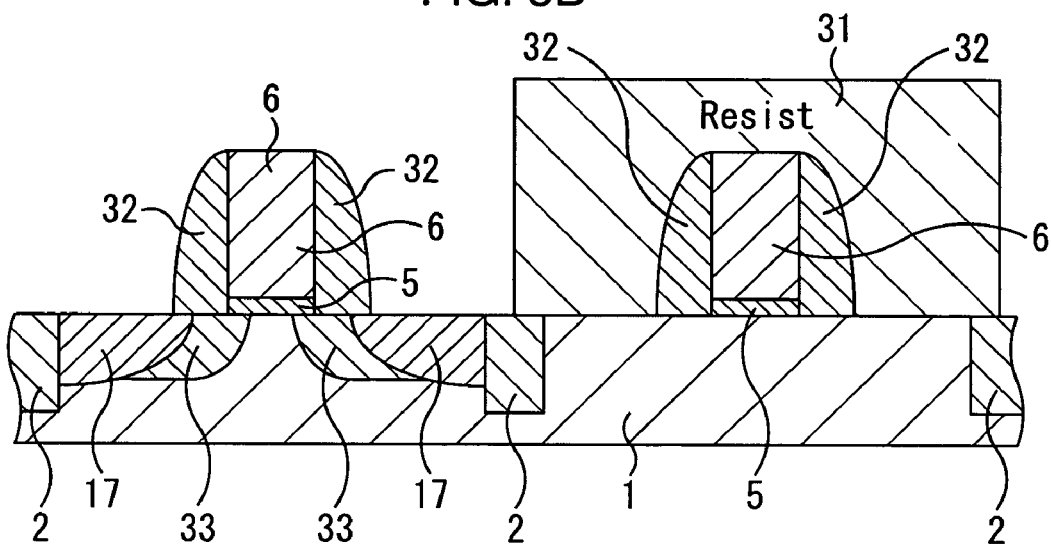

More specifically, first, as shown in FIG. 5B, a silicon oxide film is deposited on the entire surface by the CVD method or the like, and the entire surface of this silicon oxide film is subjected to anisotropic etching (etched back) to thereby leave the silicon oxide film only on side surfaces of each of the gate electrodes 6 to form dummy sidewalls 32.

A photoresist is applied onto the entire surface and fabricated by photolithography to form a resist mask 31 in which an opening only for the n-type element active region 3 is made. Then, in the n-type element active region 3 exposed from this resist mask 31, an n-type impurity, phosphorus (P) in this case, is ion-implanted into a surface layer of the semiconductor substrate 1 on both sides of the gate electrode 6 with the respective gate electrode 6 and sidewalls 32 as a mask to form deep S/D regions 17. Conditions of the ion implantation of P are an acceleration energy between 4 keV and 20 keV, a dose amount between $2\times10^{15}/cm^2$ and $2\times10^{16}/cm^2$, and a tilt angle between 0° and 10°.

Subsequently, carbon (C) which is a diffusion inhibiting substance is implanted.

More specifically, in the n-type element active region 3 exposed from the resist mask 31, carbon (C) which is the diffusion inhibiting substance is implanted into the surface layer of the semiconductor substrate 1 with the sidewalls 32 as a mask to form C diffusion regions 33 to such a degree that the C diffusion regions 33 are slightly deeper than the deep S/D regions 17. Conditions of this implantation are an acceleration energy between 2 keV and 10 keV, a dose amount between $1\times10^{14}/cm^2$ and $2\times10^{15}/cm^2$, and a tilt angle between 0° and 10°.

Figure 5C:
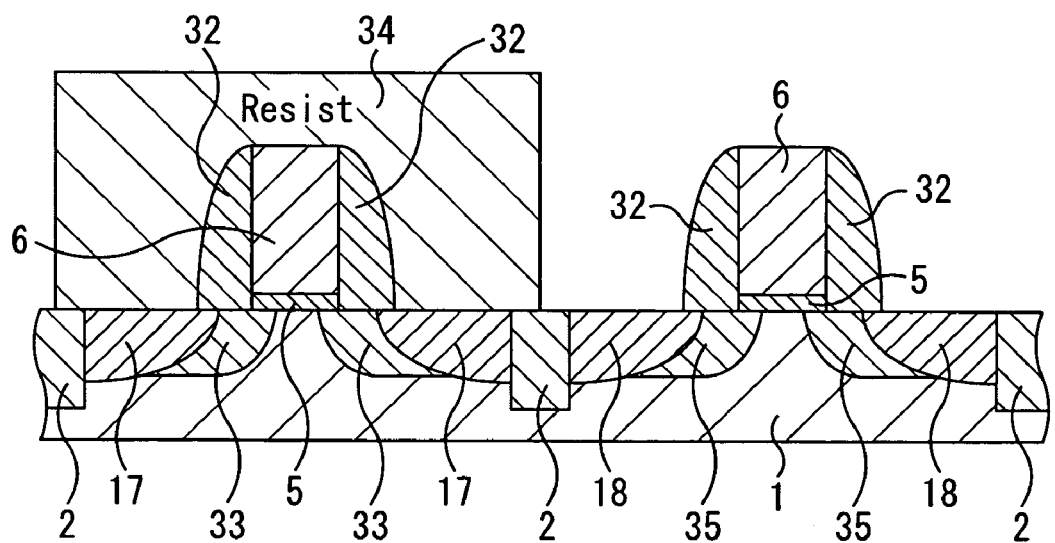

Then, in the same manner as above, as shown in FIG. 5C, after the resist mask 31 is removed by ashing or the like, a photoresist is applied onto the entire surface and fabricated by photolithography to form this time a resist mask 34 in which an opening only for the p-type element active region 4 is made. Then, in the p-type element active region 4 exposed from this resist mask 34, a p-type impurity, B in this case, is ion-implanted into the surface layer of the semiconductor substrate 1 on both sides of the gate electrode 6 with the sidewalls 32 as a mask to form deep S/D regions 18. Conditions of the ion implantation of B are an acceleration energy between 2 keV and 5 keV, a dose amount between $2 \times 10^{15}/cm^2$ and $2 \times 10^{16}/cm^2$, and a tilt angle between 0° and 10°. Incidentally, for the ion implantation of B, ions containing B such as $BF_2$ can be used.

Thereafter, carbon (C) which is the diffusion inhibiting substance is implanted.

More specifically, in the p-type element active region 4 exposed from the resist mask 34, C which is the diffusion inhibiting substance is implanted into the surface layer of the semiconductor substrate 1 with the sidewalls 32 as a mask to form C diffusion regions 35 to such a degree that the C diffusion regions 35 are slightly deeper than the deep S/D regions 18. Conditions of this implantation are an acceleration energy between 2 keV and 10 keV, a dose amount between $1 \times 10^{14}/cm^2$ and $2 \times 10^{15}/cm^2$, and a tilt angle between 0° and 10°. Incidentally, the C diffusion regions 33 and 35 may be formed before the sidewalls 32 are formed.

Then, after the resist mask 34 is removed by ashing or the like, annealing (rapid thermal annealing: RTA) is performed. An annealing condition is to fully activate the impurity at a high temperature in order to reduce resistance. An optimum value in the annealing condition needs to be fixed along with later activation annealing in extension regions, and typically it is in a range from 1025° C. to 1075° C. and from 0 seconds to 3 seconds. On this occasion, the introduction of C inhibits unnecessary lateral diffusion, which can raise only the activation of the impurity without short channel resistance being deteriorated.

Subsequently, ion-implantation to form pocket regions is first performed only in the n-type element active region 3.

Figure 6A:
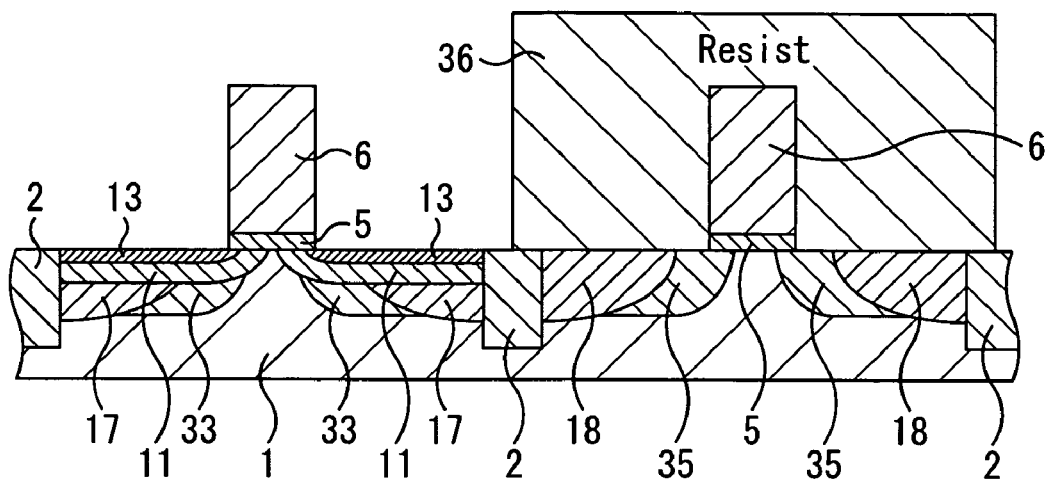
FIG. 6A to FIG. 6C are schematic sectional views, subsequent to FIG. 5A to FIG. 5C, showing the manufacturing method of the CMOS transistor according to the second embodiment step by step.
Figure 6B:
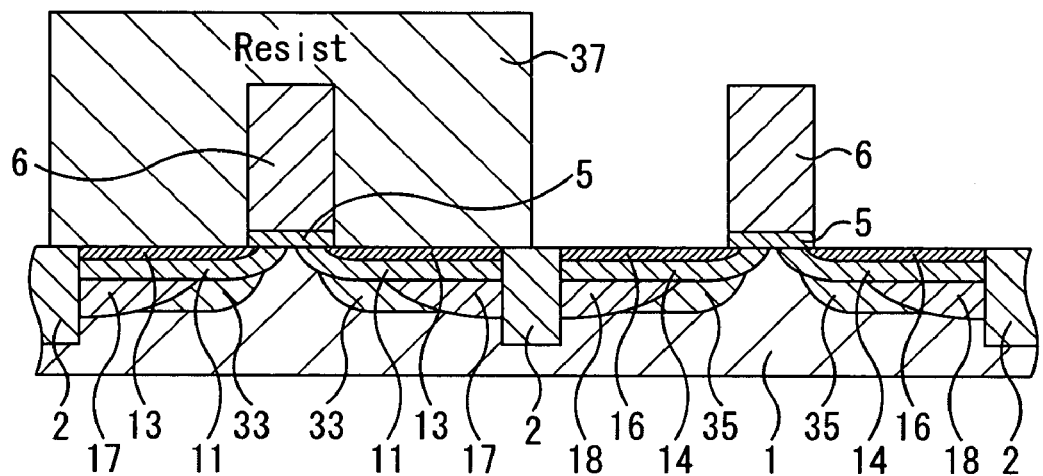

More specifically, first, as shown in FIG. 6A, after the sidewalls 32 are removed, a photoresist is applied onto the entire surface and fabricated by photolithography to form a resist mask 36 in which an opening only for the n-type element active region 3 is made.

Then, in the n-type element active region 3 exposed from the resist mask 36, a p-type impurity, indium (In) in this case, is ion-implanted into the surface layer of the semiconductor substrate 1 on both sides of the gate electrode 6 with the gate electrode 6 as a mask to form pocket regions 11.

Ion implantation is performed in a tilted state with respect to a direction perpendicular to the surface of the semiconductor substrate 1 under the following conditions of the ion implantation of In: an acceleration energy between 20 keV and 100 keV and a dose amount between $1 \times 10^{12}/cm^2$ and $2 \times 10^{13}/cm^2$. This tilt angle is between 0 and 45° with the direction perpendicular to the substrate surface as 0°. In this case, the ion implantation is performed from four directions which are respectively symmetrical with respect to the substrate surface with the aforementioned acceleration energy and dose amount. In the following description, on the premise that when the tilt angle is given, implantation from four directions is similarly performed, an explanation thereof is omitted. Incidentally, boron (B) may be used as an impurity in addition to In, but B alone is not used.

Then, ion implantation to form extension regions is performed.

More specifically, in the n-type element active region 3 exposed from the resist mask 36, phosphorus (P) which is an n-type impurity is ion-implanted into the surface layer of the semiconductor substrate 1 on both sides of the gate electrode 6 with the gate electrode 6 as a mask to thereby form extension regions 13. P has a higher solubility limit than arsenic (As), so that it has the advantage of being able to form a diffusion layer with a lower resistance at a junction of the same depth. Conditions of the ion implantation of P are an acceleration energy between 0.2 keV and 2 keV, a dose amount between $1 \times 10^{14}/cm^2$ and $2 \times 10^{15}/cm^2$, and a tilt angle between 0° and 10°.

Thereafter, as shown in FIG. 6A, after the resist mask 36 is removed by ashing or the like, a photoresist is applied onto the entire surface and fabricated by photolithography to form this time a resist mask 37 in which an opening only for the p-type element active region 4 is made.

Then, ion-implantation to form pocket regions is first performed.

More specifically, in the p-type element active region 4 exposed from the resist mask 37, an n-type impurity, antimony (Sb) in this case, is ion-implanted into the surface layer of the semiconductor substrate 1 on both sides of the gate electrode 6 with the gate electrode 6 as a mask to form pocket regions 14.

Conditions of the ion implantation of Sb are an acceleration energy between 20 keV and 100 keV, a dose amount between $2 \times 10^{12}/cm^2$ and $2 \times 10^{13}/cm^2$, and a tilt angle between 0° and 45°. Incidentally, in this case, the ion implantation may be performed using a different n-type impurity such as As or P in place of Sb.

Then, ion implantation to form extension regions is performed.

More specifically, in the p-type element active region 4 exposed from the resist mask 37, a p-type impurity, boron (B) in this case, is ion-implanted into the surface layer of the semiconductor substrate 1 on both sides of the gate electrode 6 with the gate electrode 6 as a mask to thereby form extension regions 16.

Conditions of the ion implantation of B are an acceleration energy between 0.2 keV and 0.5 keV, a dose amount between $1 \times 10^{14}/cm^2$ and $2 \times 10^{15}/cm^2$, and a tilt angle between 0° and 10°. When $BF_2$ is used here as ion species to be implanted, it becomes optimum when the acceleration energy is set between 1 keV and 2.5 keV and the dose amount is almost doubled. These optimum conditions change according to the presence or absence of sidewalls and the thickness thereof, and when the sidewalls are provided, it is necessary to set the acceleration energy rather high in the ion implantation for the formation of the pocket regions and to lead a rather large dose amount in the ion implantation for the formation of the extension regions to thereby obtain the optimum conditions.

Then, the formed extension regions 13 and 16 are activated.

Figure 6C:
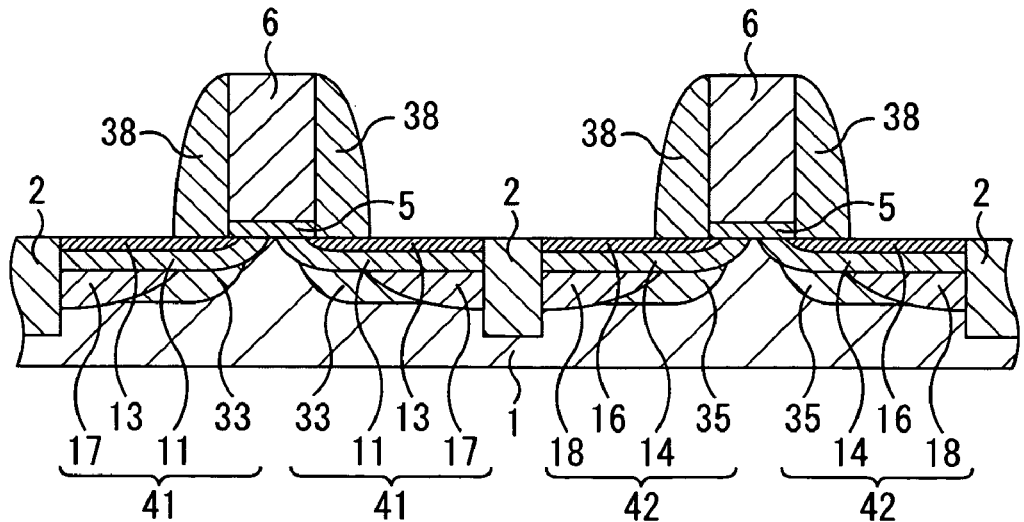

More specifically, as shown in FIG. 6C, after the resist mask 37 is removed by ashing or the like, a silicon oxide film is deposited on the entire surface by the CVD method or the like and the entire surface of the silicon oxide film is subjected to anisotropic etching (etched back) to thereby leave the silicon oxide film only on side surfaces of each of the gate electrodes 6 to form sidewalls 38.

Thereafter, the impurities are activated by annealing (RTA). This activation is performed at a relatively low temperature for a relatively short time, and inhibits unnecessary diffusion in the extension regions. The activation is performed typically in a range from 950° C. to 1025° C. and from 0 seconds to 3 seconds, that is, at a lower temperature and for a shorter time than the activation of the deep S/D regions. Consequently, n-type impurity diffusion layers 41 composed of the pocket regions 11, the C diffusion regions 33, the extension regions 13, and the deep S/D regions 17, respectively, are formed in the n-type element active region 3, and p-type impurity diffusion layers 42 composed of the pocket regions 14, the C diffusion regions 35, the extension regions 16, and the deep S/D regions 18, respectively, are formed in the p-type element active region 4.

Incidentally, there is also a method of performing activation in a nonequilibrium state by low-temperature annealing at approximately 600° C. In this case, a combination with an SOI substrate is thought to be appropriate for reducing a junction leakage. Also in the process of forming sidewalls and the activation annealing in the extension regions, the diffusion inhibiting effect of C is shown, which inhibits a deterioration in short channel resistance. Moreover, it is also possible to introduce here a diffusion inhibiting substance such as C, N, or the like at the time of ion implantation in the extension regions and the pocket regions. The annealing in the extension regions may be performed before the sidewalls 38 are formed.

Thereafter, after a forming process of an interlayer insulating film, contact holes, various kinds of wiring layers, and so on, the nMOS transistor is finished in the n-type element active region 3, and the pMOS transistor is finished in the p-type element active region 4, respectively.

As explained above, according to this embodiment, it is possible to easily and surely realize the scaling down/high integration of elements while improving threshold voltage roll-off characteristics and current drive capability and reducing a drain leakage current especially in an nMOS transistor, and by making the optimum design of a CMOS transistor possible, improve device performance and reduce power consumption.

Incidentally, in the first and second embodiments, the method of introducing C using ion implantation technology is shown as an example, but the introducing method is not limited to this example, and a method of previously forming a layer containing C in a semiconductor substrate by epitaxial technology or the like is also suitable.

INDUSTRIAL APPLICABILITY

According to the present invention, it is possible to realize a semiconductor device capable of easily and surely realizing the scaling down/high integration of elements while improving threshold voltage roll-off characteristics and current drive capability and reducing a drain leakage current, and particularly by making the optimum design of a semiconductor device having a CMOS structure possible, improving device performance and reducing power consumption.

What is claimed is:

1. A semiconductor device, comprising:
   a semiconductor substrate;
   a gate electrode formed on the semiconductor substrate with a gate insulating film therebetween; and
   a pair of impurity diffusion layers formed on a surface layer of said semiconductor substrate on both sides of said gate electrode,
   said impurity diffusion layer comprising:
   a shallow first region containing at least phosphorus (P) and partially overlapping with a lower region of said gate electrode;
   a second region containing an n-type impurity, partially overlapping with the first region, and being deeper than the first region;
   a third region containing at least indium (In); and
   a fourth region containing carbon (C).

2. The semiconductor device according to claim 1, wherein the first region contains the phosphorus (P) and arsenic (As).

3. The semiconductor device according to claim 1, wherein the third region contains the indium (In) and boron (B).

4. The semiconductor device according to claim 1, wherein a dose amount of the carbon (C) is between $1\times10^{14}$ and $2\times10^{15}/cm^2$.

5. The semiconductor device according to claim 1, wherein a dose amount of the Indium (In) is between $1\times10^{12}$ and $2\times10^{13}/cm^2$.

6. The semiconductor device according to claim 1, wherein a dose amount of the Phosphorus (P) is between $1\times10^{14}$ and $2\times10^{15}/cm^2$.

7. The semiconductor device according to claim 1, wherein the third region is deeper than the first region.

8. The semiconductor device according to claim 1, wherein the fourth region is deeper than the third region.

9. The semiconductor device according to claim 1, wherein the first region and the third region are formed as overlapping with a lower region of said gate electrode.

* * * * *